(12) United States Patent
Vershuuren

(10) Patent No.: US 11,644,749 B2
(45) Date of Patent: May 9, 2023

(54) IMPRINTING COMPOSITION AND METHOD OF FORMING A PATTERNED LAYER USING THE SAME

(71) Applicant: KONINKLIJKE PHILIPS N.V., Eindhoven (NL)

(72) Inventor: Marcus Antonius Vershuuren, Berkel-Enschot (NL)

(73) Assignee: Koninklijke Philips N.V., Eindhoven (NL)

( * ) Notice: Subject to any disclaimer, the term of this patent is extended or adjusted under 35 U.S.C. 154(b) by 325 days.

(21) Appl. No.: 16/972,639

(22) PCT Filed: Jun. 4, 2019

(86) PCT No.: PCT/EP2019/064391
§ 371 (c)(1),
(2) Date: Dec. 7, 2020

(87) PCT Pub. No.: WO2019/238460
PCT Pub. Date: Dec. 19, 2019

(65) Prior Publication Data
US 2021/0247690 A1  Aug. 12, 2021

(30) Foreign Application Priority Data

Jun. 13, 2018 (EP) .................................... 18177613

(51) Int. Cl.
*G03F 7/00* (2006.01)
*G03F 7/039* (2006.01)
*G03F 7/075* (2006.01)

(52) U.S. Cl.
CPC .......... *G03F 7/0002* (2013.01); *G03F 7/0392* (2013.01); *G03F 7/0752* (2013.01)

(58) Field of Classification Search
CPC .... G03F 7/0002; G03F 7/0392; G03F 7/0752; G03F 7/075; B82Y 10/00; B82Y 40/00
(Continued)

(56) References Cited

U.S. PATENT DOCUMENTS 8,808,969 B2  8/2014 Lin et al.
9,298,086 B2  3/2016 Verschuuren
(Continued)

FOREIGN PATENT DOCUMENTS

CN    104165912 A    11/2014
KR    20170027926   3/2017

OTHER PUBLICATIONS

International Search Report From PCT/EP2019/064391 dated Oct. 23, 2019.

*Primary Examiner* — Caleen O Sullivan

(57) ABSTRACT

Disclosed is a sol-gel imprinting ink composition comprising a sol and an additive for promoting gelation of the composition during imprinting at an imprinting temperature. The composition has a pH of 4-7 when mixed with an equal volume of deionized water and measured at 20° C. and 1 atm. The additive is the reversible reaction product of a protic acid and a proton-accepting base. The vapour pressure of the acid is higher than that of the base at the imprinting temperature such that the concentration of the base in the composition increases relative to the concentration of the acid in the composition during imprinting, resulting in basification of the composition. Further disclosed is a method of forming a patterned layer with such a sol-gel imprinting ink composition, and an optical element and an etch mask respectively including the patterned layer.

20 Claims, 5 Drawing Sheets

(58) Field of Classification Search
USPC .............................. 430/5; 428/156; 264/241
See application file for complete search history.

(56) References Cited

U.S. PATENT DOCUMENTS

| | | |
|---|---|---|
| 2010/0075108 A1 | 3/2010 | Verschuuren |
| 2011/0064925 A1* | 3/2011 | Van Bommel ......... B82Y 10/00 |
| | | 264/496 |
| 2011/0189833 A1 | 8/2011 | Sawada |
| 2012/0142126 A1 | 6/2012 | Noh |
| 2015/0291815 A1 | 10/2015 | Verschuuren |
| 2016/0246169 A1* | 8/2016 | Verschuuren ......... G03F 7/0002 |
| 2018/0305567 A1 | 10/2018 | Verschuuren et al. |
| 2020/0409257 A1* | 12/2020 | Verschuuren .......... B82Y 40/00 |

* cited by examiner

IMPRINTING COMPOSITION AND METHOD OF FORMING A PATTERNED LAYER USING THE SAME

CROSS-REFERENCE TO PRIOR APPLICATIONS

This application is the U.S. National Phase application under 35 U.S.C. § 371 of International Application No. PCT/EP2019/064391, filed on Jun. 4, 2019, which claims the benefit of EP Patent Application No. EP 18177613.9, filed on Jun. 13, 2018. These applications are hereby incorporated by reference herein.

FIELD OF THE INVENTION

The present invention relates to an imprinting composition.

The present invention further relates to a method of forming a patterned layer with such an imprinting composition.

The present invention yet further relates to an optical element and an etch mask respectively including such a patterned layer.

BACKGROUND OF THE INVENTION

Substrate Conformal Imprint Lithography (SCIL), in common with other imprint lithography techniques, involves imprinting a layer which has been applied to the surface of a substrate with a patterned stamp. The stamp may, for instance, be made from silicone rubber, such as polydimethylsiloxane (PDMS). The layer may be hardened or cured during imprinting with the stamp. When sufficient curing has occurred, the stamp is removed leaving a patterned layer on the substrate.

Various types of imprinting inks may be used, such as UV-curable and sol-gel compositions. The suitability of a curable compound for use in an imprintable medium is governed by its etch characteristics after formation of the pattern on a carrier, such as a semiconductor substrate. For this reason, compositions based on inorganic sol and sol-gel materials, such as alkoxysilane-derived sols and sol-gels, have proven popular because of their excellent etching resistance and selectivity, excellent adhesiveness and good mechanical and optical properties when condensated into polysiloxane networks. Moreover, such compositions may be used to produce patterned layers with features having dimensions ranging from less than ten nanometers to hundreds of nanometers.

In such compositions, a sol (or solution) is initially formed, e.g. by hydrolysis of an inorganic hydroxide and/or alkoxide. The sol may comprise oligomeric or linear polymeric species formed by condensation processes, during which water and/or alcohol may be released. During the manufacture of the imprint composition, or during imprinting, the sol reacts to form a sol-gel by further condensation processes which afford a three-dimensional network. Removal of solvents from the network, including the water and/or alcohol, e.g. by evaporation, results in formation of the (hardened) inorganic oxide. The sol formed from hydrolysis and polycondensation of such hydroxide or alkoxide precursors may be regarded as a colloid. The term "colloid" may refer to a solid-liquid and/or a liquid-liquid mixture in which solid or liquid particles are dispersed in a liquid medium.

Such condensation polymerization (polycondensation) reactions are typically reversible reactions, which are shifted to the polycondensation side of the equilibrium during imprinting of the composition with a permeable stamp. This is due to some of the reaction products, e.g. water or alcohol, which are released upon formation of the condensation product, being transported away from the reaction site by diffusion into/through the stamp material, as well as by evaporation, thereby disfavouring the reverse (hydrolysis or alcoholysis) reaction.

However, application of such sol-gel compositions in imprint lithography is not always straightforward. An important requirement is that the imprinting process must be reproducible in order for the process to be widely applicable on a large scale. For instance, the imprinting ink including the curable compound(s) must have an appropriate viscosity to allow facile deposition on a target substrate, and a suitable viscosity must be maintained until the imprinting ink has been imprinted with the stamp, i.e. the ink must be pliable enough for it to mold to the feature pattern on the stamp surface.

Depending on the conditions, the imprint time, defined as the time during which the stamp is in contact with the ink from a liquid to a cured gel layer which permits removal of the stamp without damaging the pattern, may vary from a few seconds to more than 12 hours. Various factors may influence the imprinting time, such as degree of condensation in the sol, the water content in the composition, the presence of co-solvents (Marc A. Verschuuren, Substrate Conformal Imprint lithography for Nanophotonics, 2010, University Utrecht, The Netherlands), the ambient conditions, e.g. relative humidity during coating of the composition onto a substrate, the temperature during imprinting, the surface chemistry of the underlying material to be imprinted on, the critical time from application of the sol-gel layer (e.g. by spincoating, inkjetting, spraycoating etc.) until the stamp is applied to the layer, and the pH of the composition. Regarding the surface chemistry factor, the imprinting time for a sol-gel layer on silicon may be less than 5 minutes at room temperature, but may be from 4 to 20 hours to imprint when the same material and stamp are applied on a surface coated with chrome or aluminium.

A key challenge in the application of this technology relates to balancing the requirements for a stable sol-gel imprinting ink composition with a sufficiently short imprinting time. A stable sol-gel imprinting ink composition may comprise a sol which undergoes gelation relatively slowly which is beneficial in terms of the shelf-life of the ink, i.e. prior to its application onto the substrate. However, the relatively slow gelation means that more time may be required for hardening. Longer imprinting times may therefore be required, such that production throughput is compromised.

The hardening process is typically accompanied by a significant degree of shrinkage and densification. The rate at which the solvent can be removed may be determined by the porosity characteristics, e.g. pore size distribution, of the gel. Moreover, the ultimate microstructure of the patterned layer may be strongly influenced by the conditions during hardening. Controlling the conditions in order to attain a patterned layer with a sufficiently high density in a relatively short imprinting time remains a challenge.

KR 2017 0027926 A discloses a composition and method for preparing an antifouling-antimicrobial barrier coating.

CN 104 165 912 A discloses preparation and application of a molecularly imprinted sol-gel polymer on the surface of graphene oxide.

WO 2008/053418 A2 discloses a relief layer and imprint method for making the same.

WO 2012/142126 A2 discloses a method of making radiation-sensitive sol-gel materials.

SUMMARY OF THE INVENTION

The invention is defined by the claims.

According to an aspect, there is provided an imprinting composition comprising: a sol; and an additive for promoting gelation of the composition during imprinting at an imprinting temperature between 15° C. and 120° C., the additive being the reversible reaction product of a protic acid and a proton-accepting base, wherein the composition has a pH of 4-7 when mixed with an equal volume of deionized water and measured at 20° C. and 1 atm, and wherein the vapour pressure of the acid is higher than that of the base at the imprinting temperature. Imprinting may comprise application of the composition to a surface before bringing the resulting composition layer in contact with the stamp or it may comprise application of the composition directly to a stamp, either or not followed by a step in which the composition applied to the stamp is sandwiched between the stamp and another surface (e.g. of a substrate). The differences in vapour pressure causes that during imprinting the composition becomes more basic (is basified). This in turn may promote hardening of the composition.

A measure of the pH of the composition may be obtained by diluting a sample of the composition with an equal volume of deionized water, and measuring the pH of the resulting mixture at normal temperature and pressure (NTP), i.e. at 20° C. and 1 atm. The present invention is partly based on the realization that adjusting the pH of the composition, as measured using this method, to 4-7 results in the composition having appropriate properties for forming a layer of the composition which is suitable for imprinting. This is thought to be due to this pH resulting in the condensation reactions being controlled such that linear oligomers are formed in the sol.

The composition further comprises an additive which is the reversible reaction product of a protic acid and a proton-accepting base. In other words, the reaction product may be regarded as an equilibrium mixture of the acid, the base, and a salt of the acid and the base. The abovementioned pH of the composition may, for example, be adjusted to the measured range of 4-7 by using appropriate amounts of the acid and the base, taking into account the pKa of the acid and the pKa of the conjugate acid of the base.

The vapour pressure of the acid is higher than that of the base at the imprinting temperature during the imprinting. The higher vapour pressure acid may be evaporated at the imprinting temperature, i.e. between 15° C. and 120° C., which drives the equilibrium associated with the reaction product to the side of the acid and the base. The lower vapour pressure of the base means that it does not evaporate to the same extent as the acid under the imprinting conditions. The lower vapour pressure of the base may also mean that diffusion of the base into the stamp layer may occur to a lesser extent than in the case of the more volatile acid. This may add to the basification of the composition during imprinting. The concentration of the base in the composition may thus increase relative to the concentration of the acid in the composition during imprinting. In this manner, the imprinting conditions cause the composition to become basic, thereby promoting three-dimensional network, i.e. gel, formation. The time required for imprinting, i.e. the time required for sufficient hardening such that the stamp can be removed, is correspondingly decreased, e.g. relative to an acidic composition which does not include the base.

The sol may be regarded as a colloid. The term "colloid" may refer to a solid-liquid and/or a liquid-liquid mixture in which solid or liquid particles are dispersed in a liquid medium. Preferably, the sol is a liquid-liquid mixture.

The sol may comprise the hydrolysis product of at least one of a trialkoxysilane and a tetraalkoxysilane. When the sol comprises the hydrolysis product of the trialkoxysilane and the tetraalkoxysilane, the molar ratio of the tetraalkoxysilane to the trialkoxysilane is preferably 1:1 to 0.45:0.55. It has been found that when a combination of an alkyl trialkoxysilane and a tetraalkoxysilane in the aforementioned ratio is used, a desirable degree of crosslinking in the gel may ultimately be attained. Preferably, the tetraalkoxysilane is selected from tetramethoxyorthosilicate and tetraethoxyorthosilicate, and the trialkoxysilane is selected from methyltrimethoxysilane and methyltriethoxysilane.

Alternatively or additionally, the sol may comprise the hydrolysis product of at least one of a titanium alkoxide, a zirconium alkoxide and a hafnium alkoxide. High quality patterned layers may be attained using such metal alkoxide-derived sol-gel systems, in relatively short imprinting times.

The base may, for example, include triethanolamine. This amine has a relatively low vapour pressure (<1.3 Pa at 20° C.) at the imprinting temperature, i.e. between 15° C. and 120° C., which means that when it is combined with an acid having a higher vapour pressure than that of the amine, e.g. formic acid, the composition may be basified during imprinting, thereby decreasing the imprinting time.

Alternatively or additionally, the base may include an alkoxysilyl-functionalised amine and the sol-gel composition comprises the condensation product of the alkoxysilyl-functionalised amine and the hydrolysis product of the silicon tetraalkoxide and/or the alkoxysilane described above. The alkoxysilyl-functionalised amine is preferably aminopropyltriethoxysilane. By incorporating the base in the polymeric structure in this manner, the vapour pressure of the base may be extremely low. Providing the vapour pressure of the acid is sufficiently high at the imprinting temperature, the composition may be basified during imprinting, thereby decreasing the imprinting time, as previously described.

The acid may include at least one of a compound represented by Formula 1 and a compound represented by Formula 2;

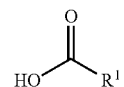

Formula 1 wherein $R^1$ is hydrogen, methyl or propyl;

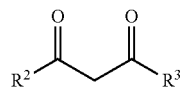

Formula 2 wherein $R^2$ and $R^3$ are individually selected from hydrogen and $C_1$-$C_3$ alkyl.

Regarding the compound represented by Formula 1, this compound may react reversibly with base to form a salt such that, at the imprinting temperature, the equilibrium may be driven to the side of the acid and the base by evaporation of the acid from the composition. In this respect, the vapour pressure of formic acid, $R^1$=H, is 4600 Pa at 20° C.; the vapour pressure of acetic acid, $R^1$=Me, is 1500 Pa at 20° C.; and the vapour pressure of propionic acid, $R^1$=Et is 390 Pa at 20° C. The relatively high vapour pressure of these compounds at the imprinting temperature, i.e. between 15° C. and 120° C., may assist their evaporation during imprinting. Providing the vapour pressure of the base is sufficiently low at the imprinting temperature, the composition may be basified during imprinting, thereby decreasing the imprinting time, as previously described.

Similar considerations apply to the compound represented by Formula 2. The carbon between the two carbonyl carbons bears an acidic proton. For example, the pKa of acetylacetone, $R^2$=$R^3$=Me, in aqueous solution is ca. 9 at 25° C. (Ionic strength=0), and the vapour pressure of acetylacetone is 920 Pa at 20° C.

The sol may include a solvent which preferably is selected such that the abovementioned linear oligomers do not phase separate out of the sol, i.e. remain dissolved. The solvent may have a vapour pressure that is low enough to avoid significant evaporation of the solvent during deposition of the composition on the substrate, as this can cause premature phase separation of the oligomers, which can deteriorate the quality of the structures formed by the imprinting process, e.g. because homogeneous deposition of the composition becomes problematic. The sol may thus comprise an alcohol, preferably at least one of 1-propanol, 2-propanol, 1-butanol, 2-butanol, t-butanol and 1-methoxy-2-propanol. Alternatively or additionally, the sol may comprise water, which may participate in hydrolysis during formation of the sol.

According to another aspect, there is provided a kit for forming the composition as defined above, wherein the kit comprises a first component which includes the acid and the sol; and a second component which includes the base.

As described above, acidic conditions are beneficial in terms of the shelf-life of the sol. The first component of the kit comprises the acid and the sol, and thus may have a shelf-life which permits, for instance, storage and transportation of the kit. Prior to use in an imprinting method, the first component may be combined with the second component which includes the base, thereby affording the sol-gel imprinting composition. Alternatively, the second component may be added during the last phase of forming a layer of the first component, or coated onto a layer of the first component immediately prior to the imprinting step.

According to still another aspect, there is provided a method of providing a patterned layer, the method comprising: providing a composition as defined above; forming a layer of the composition; and imprinting the layer with a patterned stamp at an imprinting temperature between 15° C. and 120° C., such that the layer is basified during the imprinting. The method may further comprise removing the patterned stamp after the imprinting, and optionally heating the patterned layer after removing the patterned stamp at a temperature between 70° C. and 400° C. This additional heating step may implement further hardening of the patterned layer.

According to yet another aspect, there is provided an optical element comprising a patterned layer obtainable from the method described above. The optical element may, for example, be a grating or a diffractive optical element. In particular, the optical element may be a lens, a light scattering element, a collimator, an in-coupling element, a waveguide, a photonic device such as a ring resonator, a wavelength filter or an amplitude modifier.

According to a further aspect, there is provided an etch mask comprising a patterned layer obtainable from the method described above. The etch mask may, for example, be compatible with both wet etching and dry etching, e.g. reactive ion etching, processes.

BRIEF DESCRIPTION OF THE DRAWINGS

Embodiments are described in more detail and by way of non-limiting examples with reference to the accompanying drawings, wherein.

DETAILED DESCRIPTION OF THE EMBODIMENTS

Figure 1:
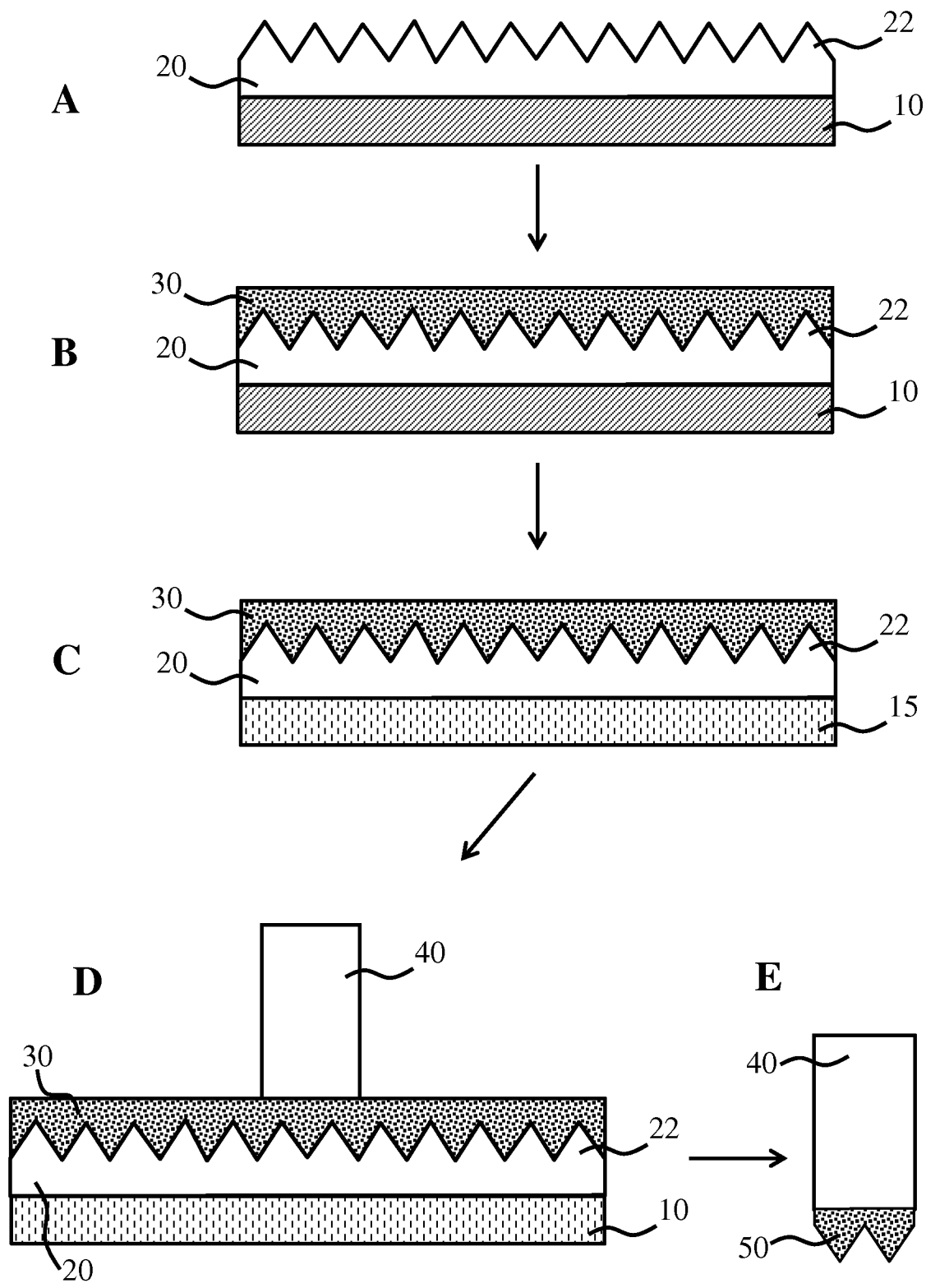
FIG. 1 schematically depicts a method of forming an imprinted layer according to an embodiment.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts, unless otherwise stated.

Embodiments of the present invention provide sol-gel ink compositions for forming patterned layers through imprinting techniques such as Substrate Conformal Imprint Lithography (SCIL) in which a stamp having a patterned surface, typically a surface carrying a pattern of features of μm and/or nm dimensions, is brought into contact with such an ink composition. It is noted for the avoidance of doubt that the term "imprinting" in the present context does not necessarily only mean that a patterned stamp is pressed onto a layer of the composition formed on the surface of a substrate. The meaning of the term "imprinting" may further extend to application of the composition directly onto the exposed pattern of a patterned stamp. This is explained further herein below with reference to the Figures.

The term "ink" in the present context should not be regarded as limiting the present imprinting composition to being suitable for producing a pattern which is coloured differently from the substrate. The light absorbance properties of the imprinting composition are thus not limited by the term "ink".

A sol-gel imprinting ink composition comprises a sol and an additive for promoting gelation of the composition during imprinting at an imprinting temperature. The composition has a pH of 4-7 when mixed with an equal volume of deionized water and measured at 20° C. and 1 atm. The additive is the reversible reaction product of a protic acid and a proton-accepting base. The vapour pressure of the acid is higher than that of the base at the imprinting temperature such that the concentration of the base in the composition increases relative to the concentration of the acid in the composition during imprinting, resulting in basification of the composition.

In an embodiment, the imprinting temperature is 15° C. to 120° C., such as 20° C. to 60° C. Preferably, the imprinting temperature is 20° C. to 55° C.

In an embodiment, the sol comprises the hydrolysis product of at least one of a trialkoxysilane and a tetraalkoxysilane. For example, the sol may comprise the hydrolysis product of a trialkoxysilane and a tetraalkoxysilane. The sol-gel chemistry of such a system is shown in Reaction Scheme I, which is for illustrative purposes only. The various reactions shown in Reaction Scheme I are analogous to other sol-gel systems, such as those derived from titanium alkoxide, zirconium alkoxide or hafnium alkoxide precursors.

the gel may ultimately be attained. Preferably, the tetraalkoxysilane is selected from tetramethoxyorthosilicate and tetraethoxyorthosilicate, and the trialkoxysilane is selected from methyltrimethoxysilane and methyltriethoxysilane. Alternatively or additionally, the sol may comprise the hydrolysis product of at least one of a titanium alkoxide, a zirconium alkoxide and a hafnium alkoxide.

The sol-gel imprinting ink composition may, for instance, further comprise nanoparticles, i.e. dispersed in the sol. Such nanoparticles may be transition metal oxide nanoparticles, e.g. titania nanoparticles, which may result in a patterned layer having a higher refractive index. Higher refractive index patterned layers are desirable for optical applications. The basification of the composition during imprinting may modify the nanoparticle agglomeration behaviour of the composition and steer crosslink formation and curing. Alternatively, the sol-gel imprinting ink composition may be free of such nanoparticles. The sol-gel imprinting ink composition may, for instance, be completely dissolved prior to layer forming and imprinting.

In order to obtain a measure of the pH of the composition, a sample of the composition may be mixed with an equal volume of deionized water. In other words, the volume ratio of the sample of the composition to the deionized water is 1:1. The pH of the resulting mixture may be measured at normal temperature and pressure (NTP), i.e. 20° C. and 1 atm. A suitable calibrated pH probe may, for instance, be used for this purpose. Alternative reliable means of measur-

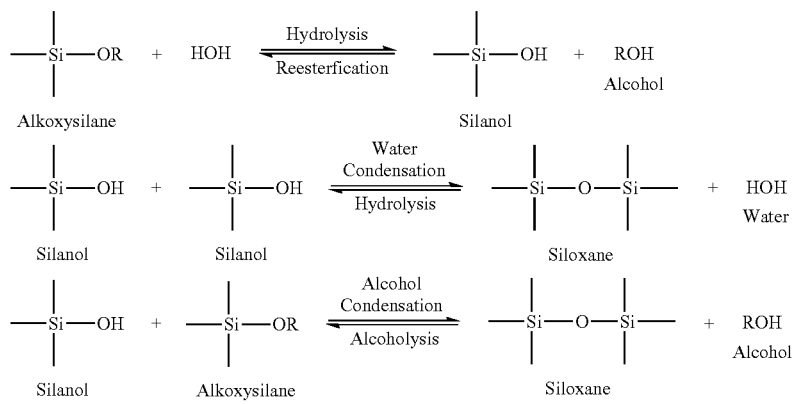

Reaction Scheme I

In the reaction to form a sol-gel system, alkoxysilanes may be used which undergo the reaction steps as shown in Reaction Scheme I in the presence of an acid or a base. Reaction Scheme I shows the acid-catalyzed reaction. The alkoxysilanes undergo a hydrolysis, which is followed by a condensation reaction between two hydrolyzed alkoxysilanes (water condensation reaction) or between a hydrolyzed alkoxysilane and an unreacted alkoxysilane (alcohol condensation reaction) in which the crosslinked inorganic network is formed. The degree of crosslinking may be controlled by appropriate choice of the alkoxysilanes, pH, reaction temperature, water ratio and co-solvents.

When the sol comprises the hydrolysis product of the trialkoxysilane and the tetraalkoxysilane, the molar ratio of the tetraalkoxysilane to the trialkoxysilane is preferably 1:1 to 0.45:0.55. It has been found that when a combination of an alkyl trialkoxysilane and a tetraalkoxysilane in the aforementioned ratio is used, a desirable degree of crosslinking in ing the pH, e.g. pH titration, are known by the skilled person. The pH of the composition may, for example, be adjusted to the measured range of 4-7 by using appropriate amounts of the acid and the base. The $pK_a$ of the acid and the $pK_a$ of the conjugate acid of the base may be taken into account for adjusting the pH, as will be readily appreciated by the skilled person.

The present invention is based partly on the realization that adjusting the pH of the composition such that the pH, as measured using this method, is 4-7 results in the composition having appropriate properties, e.g. viscosity, for forming a layer of the composition which is suitable for imprinting. This pH has also been found to extend the shelf-life of the composition, e.g. relative to for instance a composition having a pH, as measured using this method, which is greater than 7.

Without wishing to be bound by any particular theory, this pH may result in the condensation reactions being controlled such that the linear oligomers are present in the sol. The linear oligomers may, for instance, have a polymerization degree of 2-20.

Preferably, the composition has a pH of 4-6, such as 4.5-5.5, when mixed with an equal volume of deionized water and measured at 20° C. and 1 atm. The extent of network formation may be lower when the composition has a pH of 6-7, as measured using the abovementioned method, such that dewetting of an initially formed layer of the composition on a substrate surface may occur, and the final crosslinking during imprinting may take longer, e.g. relative to a composition having a pH of 4-6 or 4.5-5.5, as measured using the abovementioned method.

Whilst the pH range of 4-7 may have advantages in terms of the shelf-life of the composition, and its applicability to a substrate so as to form a dense patterned layer, such a pH may mean that condensation reactions, i.e. which lead to gel formation, proceed relatively slowly. A longer imprinting time, e.g. relative to the imprinting time for a basic sol-gel composition, may be required for the crosslinking to occur to the extent that the stamp may be removed without causing damage to the patterned layer.

Basic conditions, however, may promote undesirable formation of three-dimensionally crosslinked oligomers in the sol. The solidified layer formed from such crosslinked oligomers may be more prone to (post-process) shrinking. A sol-gel imprinting ink composition comprising a sol which is basic prior to imprinting may result in a patterned layer which has a relatively high porosity, which leads to a lower density patterned layer having poorer mechanical and optical properties.

Basic conditions are, however, desirable during imprinting, when formation of the three-dimensional network, i.e. gel, is required. The higher vapour pressure of the acid relative to that of the base at the imprinting temperature, e.g. 15° C. to 120° C., means that the concentration of the base in the composition increases relative to the concentration of the acid in the composition during imprinting, which permits basification of the layer during imprinting. The basification, i.e. the pH increasing above 7, of the layer favours three-dimensional network formation. The time required for imprinting, i.e. the time required for sufficient gelation and hardening such that the stamp can be removed, is correspondingly decreased, e.g. relative to a composition which does not include the base.

The condensation polymerization (polycondensation) reactions which occur in a sol-gel composition are typically reversible reactions, which are shifted to the polycondensation side of the equilibrium during imprinting of the composition with a permeable stamp. This is due to some of the reaction products, e.g. water or alcohol, which are released upon formation of the condensation product, being transported away from the reaction site by diffusion into/through the stamp material, as well as by evaporation, thereby disfavouring the reverse (hydrolysis or alcoholysis) reaction. The acid may also diffuse into the stamp during imprinting. Removal of such reaction products, as well as the acid, during imprinting may further serve to increase the concentration of the base in the layer, thereby driving basification of the layer and thus promoting gelation and hardening.

It will be evident from the foregoing that formation of a three-dimensional network is favoured under basic conditions. A relatively high porosity, i.e. low density, layer may be avoided due to the removal of solvents from the layer during imprinting. The basic conditions may drive the equilibria as shown, for instance, in Reaction Scheme I, towards condensation, releasing additional alcohols and water, which may be quickly absorbed by the stamp, due to the higher concentration of these molecules in the layer than in the stamp. Both effects, i.e. increased condensation rate and removal of reaction products, may lead to a faster formation of a solid material and allow the stamp to be removed in a shorter time, compared to acidic or neutral imprint conditions.

The sol-gel imprinting ink composition may thus allow a higher throughput in automated nanoimprint tooling, such as the AutoSCIL™ volume production series machines from Philips SCIL Nanoimprint Solutions.

Moreover, the sol-gel imprinting ink composition may provide suitably dense patterned layers, as will be discussed with reference to the examples. Stamp longevity may also be improved when the sol-gel imprinting ink according to present embodiments is employed. Furthermore, the sol-gel imprinting ink may also be less sensitive to variations in the surface chemistry of different substrates, and variability of other parameters such as ambient relative humidity, the presence of co-solvents and the critical time from application of the sol-gel layer until the stamp is applied to the layer.

The composition comprises both a protic acid and a proton-accepting base. However, as described above the sol-gel imprinting ink composition has a pH of 4-7 when mixed with an equal volume of deionized water and measured at 20° C. and 1 atm. This may mean that the acid and the base are in equilibrium with the salt of the acid and the base. The additive may thus be considered as an equilibrium mixture of the acid, the base, and the salt of the acid and the base. In other words, the additive for promoting gelation of the composition during imprinting may be regarded as the reversible reaction product of the acid and the base. Hydrolysis of the salt to the acid and the base may be favoured at the imprinting temperature, e.g. between 15° C. to 120° C., so as to permit the acid to evaporate and the base to basify the layer during imprinting.

The base may, for instance, be a "weak base", indicating that the base does not fully dissociate in aqueous solution. The $pK_a$ of the conjugate acid of the base in aqueous solution may, for instance, range from 3 to 11 at 25° C. (Ionic strength=0). The base may, for instance, include, or consist of, an amine, since the $pK_a$ of the conjugate acid of an amine in aqueous solution may be in the abovementioned range.

In an embodiment, the base includes triethanolamine. In certain examples, the base consists of triethanolamine. Triethanolamine has a relatively low vapour pressure (<1.3 Pa at 20° C.) at the imprinting temperature, i.e. between 15° C. and 120° C., which means that when it is employed with an acid, e.g. formic acid, having a higher vapour pressure than that of the base, the composition may be basified during imprinting, thereby decreasing the imprinting time, as previously described.

Amine bases, such as triethanolamine, may be suitable because of their compatibility with sol-gel compositions, and may not undergo phase separation from the composition during coating and imprinting. Such bases may also have relatively low toxicity and a prolonged shelf-life. Importantly, amine bases, such as triethanolamine, may not degrade a PDMS stamp, and absorption of the base in the PDMS may be minimal, thereby assisting to basify the layer and decrease the imprinting time, as explained above. The base preferably does not contain Na, K, Li, Rb, Cs, Ca, Sr, Ba. This is to ensure that the patterned layer is compatible with complementary metal-oxide-semiconductor (CMOS) processes.

Alternatively or additionally, the base may include an alkoxysilyl-functionalised amine and the sol-gel composition comprises the condensation product of the alkoxysilyl-functionalised amine and the hydrolysis product of the silicon tetraalkoxide and/or the alkoxysilane described above. The alkoxysilyl-functionalised amine is preferably aminopropyltriethoxysilane. By incorporating the base in the polymeric structure in this manner, the vapour pressure of the base may be extremely low. Providing the vapour pressure of the acid, e.g. formic acid, is sufficiently high at the imprinting temperature, the composition may be basified during imprinting, thereby decreasing the imprinting time, as previously described.

The acid may, for instance, be a "weak acid", indicating that the acid does not fully dissociate in aqueous solution. In other words, the acid is not completely, i.e. irreversibly, deprotonated. The $pK_a$ of the acid in aqueous solution may, for instance, range from 2 to 10 at 25° C. (Ionic strength=0).

The acid and the base are selected such that they react reversibly at the imprinting temperature. This involves consideration of the pKa of the acid and the pKa of the conjugate acid of the base, i.e. the respective equilibrium constants corresponding to the proton donation of the acid and the proton acceptance by the base, as will be immediately apparent to the skilled person.

The vapour pressure of the acid is higher than that of the base at the imprinting temperature. The values for the respective vapour pressures of the acid and the base per se may be different when the acid and the base are in the presence of other components, in this case the other components of the sol-gel composition. However, ensuring that the vapour pressure of the acid per se is higher than that of the base per se may ensure that the acid vapour pressure is also higher than the base vapour pressure in the composition. For example, the vapour pressure of the acid per se may be greater than 300 Pa at 20° C., and the vapour pressure of the base per se may be less than 10 Pa at 20° C.

ASTM E1194-17 describes procedures for measuring the vapour pressure of pure liquid or solid compounds. No single technique is able to measure vapour pressures from $1 \times 10^{-11}$ to 100 kPa (approximately $10^{-10}$ to 760 torr). The subject of ASTM E1194-17 is gas saturation which is capable of measuring vapour pressures from $1 \times 10^{-11}$ to 1 kPa (approximately $10^{-10}$ to 10 torr). Other methods, such as isoteniscope and differential scanning calorimetry (DSC) are suitable for measuring vapour pressures above 0.1 kPa. An isoteniscope (standard) procedure for measuring vapour pressures of liquids from $1 \times 10^{-1}$ to 100 kPa (approximately 1 to 760 torr) is available in Test Method D2879. A DSC (standard) procedure for measuring vapour pressures from $2 \times 10^{-1}$ to 100 kPa (approximately 1 to 760 torr) is available in Test Method E1782.

In an embodiment, the percentage difference in the respective vapour pressures of the acid and the base, i.e. (the vapour pressure of the acid (per se)–the vapour pressure of the base (per se)/vapour pressure of the acid (per se))*100, is at least 50%, such as greater than 70%, e.g. greater than 90%.

The acid may include at least one of a compound represented by Formula 1 and a compound represented by Formula 2;

Formula 1

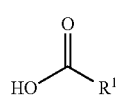

wherein $R^1$ is hydrogen, methyl or propyl;

Formula 2

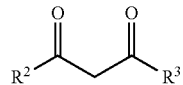

wherein $R^2$ and $R^3$ are individually selected from hydrogen and $C_1$-$C_3$ alkyl.

Regarding the compound represented by Formula 1, this compound may react reversibly with base to form a salt such that, at the imprinting temperature, the equilibrium may be driven to the side of the acid and the base by evaporation of the acid from the composition. In this respect, the vapour pressure of formic acid, $R^1$=H, is 4600 Pa at 20° C.; the vapour pressure of acetic acid, $R^1$=Me, is 1500 Pa at 20° C.; and the vapour pressure of propionic acid, $R^1$=Et is 390 Pa at 20° C. The relatively high vapour pressure of these compounds at the imprinting temperature, i.e. between 15° C. and 120° C., may assist their evaporation during imprinting. Providing the vapour pressure of the base is sufficiently low at the imprinting temperature, the composition may be basified during imprinting, thereby decreasing the imprinting time, as previously described.

Similar considerations apply to the compound represented by Formula 2. The carbon between the two carbonyl carbons bears an acidic proton. For example, the pKa of acetylacetone, $R^2$=$R^3$=Me, in aqueous solution is ca. 9 at 25° C. (Ionic strength=0), and the vapour pressure of acetylacetone is 920 Pa at 20° C.

The sol may include a solvent which preferably is selected such that the abovementioned linear oligomers do not phase separate out of the sol, i.e. they remain dissolved. The solvent may have a vapour pressure that is low enough to avoid significant evaporation of the solvent during ink deposition on the substrate, as this can cause premature phase separation of the oligomers, which can deteriorate the quality of the structures formed by the imprinting process, e.g. because homogeneous deposition of the ink becomes problematic. The sol may thus comprise an alcohol, preferably at least one of 1-propanol, 2-propanol, 1-butanol, 2-butanol, t-butanol and 1-methoxy-2-propanol.

Alternatively or additionally, the sol may comprise water, which may participate in hydrolysis during formation of the sol. The water may, for instance, be included in an amount of 5-20 mole per mole of metal/metalloid, e.g. silicon, in the composition. For example, the water may be included in the composition in an amount of 1 mole per mole of alkoxy group. It has been found that when the water content is selected within this range, particularly desirable oligomerization characteristics are obtained.

In a preferred embodiment, the sol comprises the reaction product of tetramethoxyorthosilicate (TMOS) and methyltrimethoxysilane (MTMS) in a water-alcohol mixture. The acid is preferably one or more of formic acid, acetic acid and propionic acid, and the base is an amine base, in particular triethanolamine (TEA) and/or aminopropyltriethoxysilane (APTES).

In an embodiment, the ink or composition of the present invention has a composition selected from the ranges as specified in Table I. In Table I, where reference is made to weight percentages (wt. %), this is relative to the total weight of the composition unless otherwise specified.

TABLE I

| Compound | Concentration Range |
| --- | --- |
| Monomeric sol-gel precursors, e.g. the trialkoxysilane and the tetraalkoxysilane | 1-20 wt. %; e.g. 5 wt. % solids, based of fully condensed trialkoxysilane and the tetraalkoxysilane |
| Water | 1 mole per mole of alkoxy group (or 2-40 wt. %) |
| Alcohol, e.g. a mixture of 1-propanol and 1-butanol | 25-98 wt. % |
| Protic acid, e.g. formic acid and/or acetic acid | 0.1-1 wt. % (depending on the pKa of the acid - the amount of the acid and the base should set the pH of the composition to around 4-7, e.g. 4-6 or 4.5-5.5) |
| Proton-accepting base, e.g. TEA and/or APTES | 0.1-1 wt. % (depending on the pKa of the conjugate acid of the base - the amount of acid and the base should set the pH of the composition to around 4-7, e.g. 4-6 or 4.5-5.5) |

The sol-gel precursors, protic acid, water, and solvents may be combined in order to effect acid hydrolysis. The base may be subsequently added to the hydrolysed mixture.

In an embodiment, the sol-gel imprinting ink composition may be supplied as a kit, wherein the kit comprises a first component which includes the acid and the sol; and a second component which includes the base. As described above, acidic conditions are beneficial in terms of the shelf-life of the sol. The first component of the kit comprises the acid and the sol, and thus may have a shelf-life which permits, for instance, storage and transportation of the kit. Prior to use in an imprinting method, the first component may be combined with the second component which includes the base, thereby affording the sol-gel imprinting ink composition. Alternatively, the second component may be added during the last phase of forming a layer of the first component, or coated onto a layer of the first component immediately prior to the imprinting step.

A method of providing a patterned layer comprises providing the sol-gel imprinting ink composition described above, forming a layer of the composition and imprinting the layer with a patterned stamp at an imprinting temperature between 15° C. and 120° C., such that the layer is basified during the imprinting.

The forming may, for instance, involve spincoating, inkjetting, spraycoating etc., onto the substrate. Spin coating is specifically mentioned as layers of substantially uniform thickness, e.g. 20 nm to 1 μm, can be achieved in this manner.

The method may further comprise removing the patterned stamp after the imprinting, and optionally heating the patterned layer after removing the patterned stamp at a temperature between 70° C. and 400° C. This additional heating step may implement further hardening of the patterned layer during which further polycondensation reactions may occur and/or volatile components, e.g. alcohol(s) and water, may be evaporated from the patterned layer.

Next, an embodiment of a method of forming a patterned layer using an imprinting ink composition according to one or more embodiments described above will be explained with the aid of FIG. 1, which schematically depicts such a method.

In step A, a substrate 10 is provided as a support for an elastomeric stamp 20 having a major surface carrying a pattern 22. The features of the pattern 22 typically have μm or nm dimensions, i.e. widths and heights of such dimensions. The pattern 22 may be formed in any suitable manner, for example by creating at least the patterned surface of the elastomeric stamp 22 in a master mould as is well-known per se. The elastomeric stamp 20 preferably is permeable such that targeted constituents of the imprinting ink composition can diffuse into the stamp material and may be made of any suitable elastomeric material, e.g. a polysiloxane such as PDMS or another rubber-like stamp material having a low Young's modulus or having a suitably high permeability for water, alcohols and solvents, such as PFPE (Acryloxy Perfluoropolyether). A suitable Young's modulus for example lies within the range of 2-100 MPa. For the avoidance of doubt it is noted that the reported Young's moduli have been determined by a standardized hardness test according to the ASTM D1415-06(2012) standard by penetrating the rubber material with a rigid ball under the conditions mandated by the standard. The elastomeric stamp 20 may be made from a bulk material or may be built up in layers. The elastomeric stamp 20 may be placed on the substrate 10 such that its patterned surface is exposed, as shown in step A. Any suitable substrate 10 may be used for this purpose, e.g. a glass substrate, a semiconductor substrate such as a silicon substrate, sapphire, and so on.

In step B, an imprinting ink composition 30 according to an embodiment is deposited over the pattern 22 of the elastomeric stamp 20 using any suitable deposition technique, such as blading, printing or spin coating by way of non-limiting example. As previously explained, besides the evaporation of solvents to the environment, the interaction between the imprinting ink composition 30 and the elastomeric stamp 20 will initiate gelation of the imprinting ink composition 30, due to the diffusion of one or more solvents and/or the acid into the elastomeric stamp material, and evaporation of the acid, thereby causing hardening of the layer as previously explained.

In an optional step C, at this stage the substrate 10 may be replaced by a foam 15 to increase the absorption capacity of the elastomeric stamp 20, as the components diffusing from the imprinting ink composition 30 into the stamp reservoir may further be stored in porous structure of the foam 15. Foams are preferred as they have an open pore structure. Any suitable type of foam, e.g. polyurethane foam, may be used for this purpose. Alternatively, the absorption capacity of the stamp can be tuned by incorporating layers of different materials which absorb more solvents or using a SCIL stamp layout in which a non-permeable back-plate material such as glass is replaced by a more permeable polymer or a perforated plate.

Step D is another optional step in which a body 40 such as an optical body, e.g. a light guide or the like, is placed on the imprinting ink composition 30. This, for instance, may be used in order to provide an optical element 100 in which the patterned layer as formed from the imprinting ink composition 30 is used as an optical layer on the body 40. For example, the patterned layer may act as a refractive layer or out-coupling layer on the body 40 in order to shape a luminous output from light coupled into the body 40. By curing the imprinting ink composition 30 in order to form a patterned layer 50, the patterned layer 50 may be adhered to the body 40, for instance to yield an optical element 100 as shown in step E.

The hardening of the imprinting ink composition 30 while it is in contact with the pattern 22 may be performed at an imprinting temperature between 15° C. and 120° C. The imprinting time may be for a period of as little as 10 seconds. Longer imprinting periods, e.g. up to 60 minutes, are also conceivable, although such periods may be unnecessarily long in view of the rapid hardening of the composition 30 at the abovementioned imprinting temperature. Optionally, the imprinting ink composition 30 may be subjected to further stimuli, e.g. optical stimuli such as UV radiation. This for instance may be advantageous if the imprinting ink composition 30 comprises polymerizable content in addition to the sol.

In at least some embodiments, before or after releasing the elastomeric stamp 20 from the cured imprinted layer, the cured imprinted layer may be subjected to a (post-)curing step at elevated temperatures, for example to release residual volatile compounds, e.g. solvents, from the cured imprinted layer to further densify this layer. For example, the cured imprinted layer may be post-cured at about 70-400° C. Any suitable period may be contemplated for the post-curing, although prolonged periods may be avoided if the substrate (or other layers) on which the patterned layer is formed may be damaged by extended heating. The post-curing period may be, for instance, up to about 15 minutes.

Figure 2:
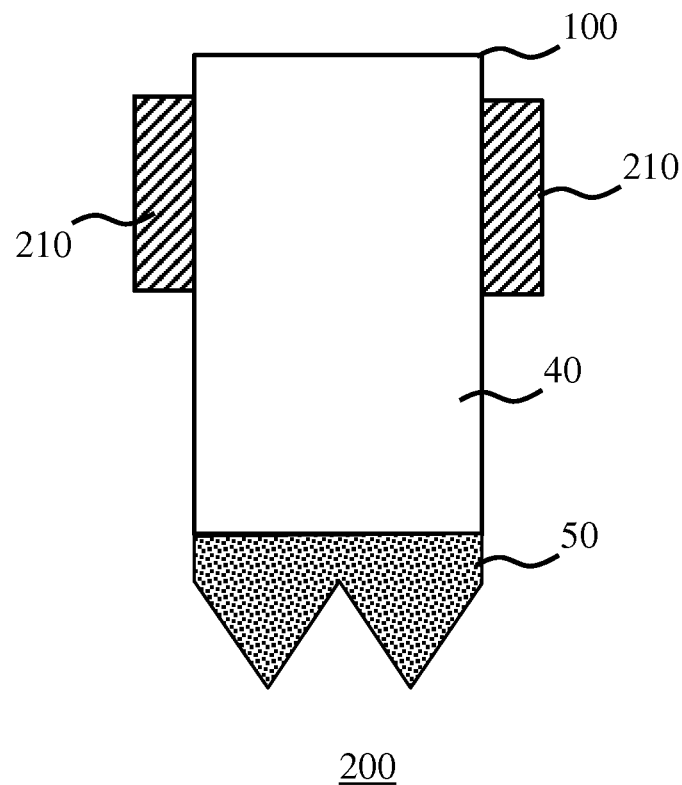
FIG. 2 schematically depicts a lighting device according to an embodiment.

FIG. 2 schematically depicts a lighting device 200 comprising an optical element 100 according to an example embodiment. The optical element 100, here a light guide, is optically coupled to a number of solid state lighting elements 210, e.g. LEDs. The optical coupling ensures that the light emitted by the solid state lighting elements 210 is coupled into the light guide body 40 and directed towards the patterned layer 50 formed from the imprinting ink composition 30, with the patterned layer 50 causing the light travelling through the light guide body 40 to be coupled out of the light guide body 40. The solid state lighting elements 210 may be LEDs of any suitable colour or combination of colours, e.g. white LEDs, blue LEDs, green LEDs, and so on.

In an example embodiment, the lighting device 200 is a projection device in which the patterned layer 50 is arranged to concentrate (collimate) the light exiting the light guide body 40 in order to generate a collimated light beam. This yields a particularly compact collimator compared to for instance compound parabolic concentrators that are commonly used for this purpose. The projection device may comprise a plurality of modules for generating a light beam of a primary colour, which light beams may be combined onto a projection lens to generate a colour image as is well-known per se. At least one of such modules may comprise the optical element 100 in order to generate the collimated light beam. In an embodiment, the optical element 100 is further configured as a wavelength conversion element, for instance to convert light from blue LEDs into green light (e.g. about 450 nm to about 500 nm conversion). The lighting device 200 alternatively may form a light rod in which the optical element 100 acts as a light guide and optionally further acts as a wavelength conversion element.

Figure 3:
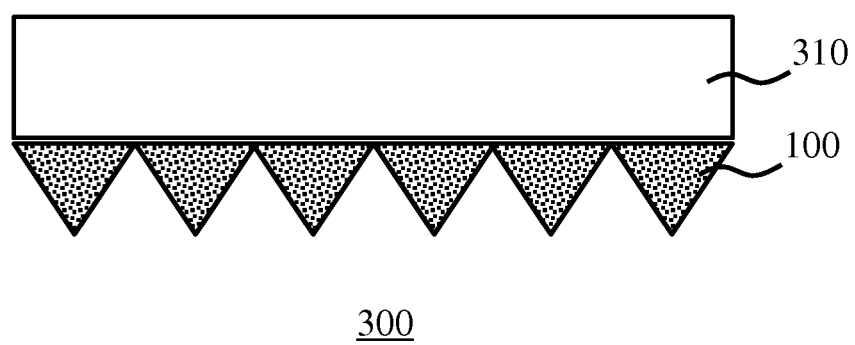
FIG. 3 schematically depicts a lighting device according to another embodiment.

It should be understood that many other embodiments of an optical element 100 are equally feasible. FIG. 3 for example schematically depicts another example embodiment in which the optical element 100 is optically coupled, e.g. in physical contact with, a solid state lighting chip or package 310, e.g. a LED chip or package, wherein the optical element 100 is configured as a lens element or collimator to yield a lighting device 300 such as a light bulb or the like.

The optical element 100 may be integrated in other types of devices, e.g. other types of electronic devices. For example, the optical element 100 may form part of an optical sensor in which the optical element 100 for instance may be used as a light-harvesting layer of the optical sensor.

Alternatively, the optical element 100 may form part of a photovoltaic device such as a solar cell or solar panel, which photovoltaic device typically comprises one or more photovoltaic cells for converting light into electricity. In such a device, the optical element 100 for instance may be used as an in-coupling layer for the one or more photovoltaic cells, for example a patterned layer of a flat silicon substrate acting as a light trapping layer. Such light trapping layers are known per se, as for instance explained by Spinelli et al. in Applied Physics Letters, 102, 233902 (2013) and will therefore not be explained in further detail for the sake of brevity only. It is noted for the avoidance of doubt that the patterned light trapping layer (antireflection coating) such as in this citation can be produced in a single step process with the imprinting ink composition and imprinting method according to embodiments of the present invention.

It is reiterated that the optical element 100 is not limited to the aforementioned embodiments; any embodiment in which an appropriately dimensioned patterned layer 50 may be used to interact with light in a predetermined manner may be considered. Examples of such optical elements include lenses, light scattering elements, collimators, in-coupling elements, waveguides, photonic devices such as ring resonators, wavelength filters, amplitude modifiers, and so on. Other embodiments will be apparent to the skilled person. It is furthermore noted that the optical element 100 may be integrated in lighting devices, e.g. electronic devices, energy harvesting devices such as solar panels, where the optical element may be used as an in-coupling device, and so on.

Figure 4:
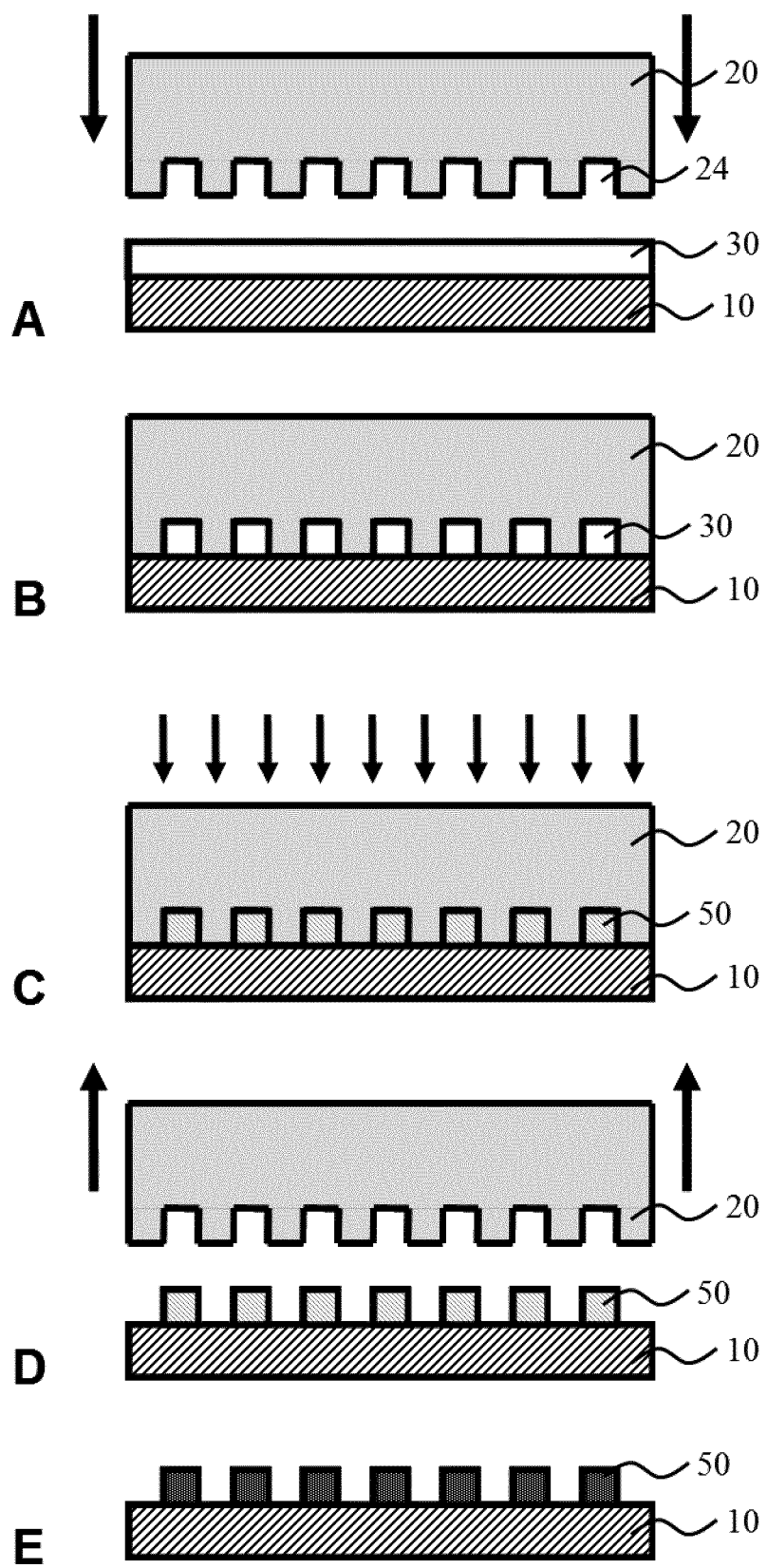
FIG. 4 schematically depicts a method of forming an imprinted layer according to another embodiment.

An alternative embodiment of the method of the present invention is schematically depicted in FIG. 4. In step A, a substrate 10, which may be any suitable substrate, e.g. a semiconductor substrate such as a silicon substrate, a SiGe substrate, a silicon on insulator substrate, a GaAs substrate and so on, is covered with a layer of an imprinting ink composition 30 according to an embodiment of the present invention. The imprinting ink composition 30 may be applied in any suitable manner, e.g. by spincoating, inkjetting, spraycoating etc, although spin coating is specifically mentioned as layers of substantially uniform thickness can be achieved in this manner. Additionally, ink-jet printing and subsequent imprinting yields uniform layers due to the capillary forces, e.g. due to surface tension of polar solvents after dispensing the droplets as well as underneath the stamp, causing the redistribution of the imprinting ink material to obtain a uniform thickness.

An elastomeric stamp 20 having a major surface carrying a pattern 22 is imprinted into the curable imprinting ink composition 30, thereby transferring the pattern 22 into this layer, as shown in step B. The features of the pattern 22 typically have μm or nm dimensions, i.e. widths and heights of such dimensions. The pattern 22 may be formed in any suitable manner, for example by creating at least the patterned surface of the elastomeric stamp 22 in a master mould as is well-known per se. The elastomeric stamp 20 preferably is permeable and may be made of any suitable elastomeric material, e.g. a polysiloxane such as PDMS or another rubber-like stamp material having a low Young's modulus or having a suitably high permeability for water, alcohols and solvents, such as PFPE (Acryloxy Perfluoropolyether). The elastomeric stamp 20 may be made from a bulk material or may be built up in layers of varying Young's modulus.

Next, as depicted in step C, the imprinted layer of the imprinting ink composition 30 is cured, which optionally may comprise the application of a stimulus such as heat and/or UV radiation as previously explained.

Upon completion of the polymerization reaction(s) in the imprinted layer of the imprinting ink composition 30, the elastomeric stamp 20 is released from this layer in step D, leaving behind the patterned layer 50 on the substrate 10, which retains its shape due to the network formed by the polycondensation reactions. The patterned layer 50 may be densified further, e.g. by exposure to heat, e.g. to remove remaining solvent(s), as previously described.

Figure 5:
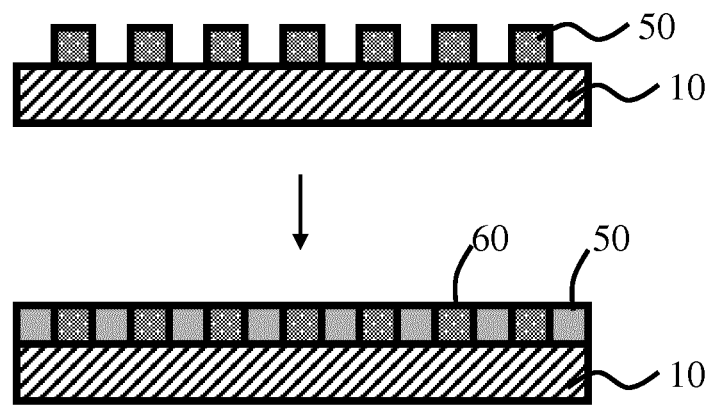
FIG. 5 schematically depicts an aspect of a method of forming an imprinted layer according to a further embodiment.

The method as schematically depicted in FIG. 4 may be used to form three-dimensional structures built up from patterned layers 50. Such three-dimensional structures may be produced by filling or planarizing the patterned layer 50 by depositing a sacrificial planarization material 60 over the patterned layer 60, as shown in FIG. 5, and removing excess material if necessary, e.g. by etching or polishing. The sacrificial planarization material 60 preferably is a thermally degradable material, and may be any suitable thermally degradable material such as a thermally degradable polymer (TDP). A non-limiting example of a TDP is polynorbornene or polystyrene. Alternatively, the sacrificial planarization material 60 may be soluble in a particular solvent. In general, any sacrificial planarization material 60 that can be selectively removed from a formed multi-layer structure without damaging the patterned layers 50 formed from the curable imprinting ink composition 30 according to an embodiment of the present invention may be used.

Figure 6:
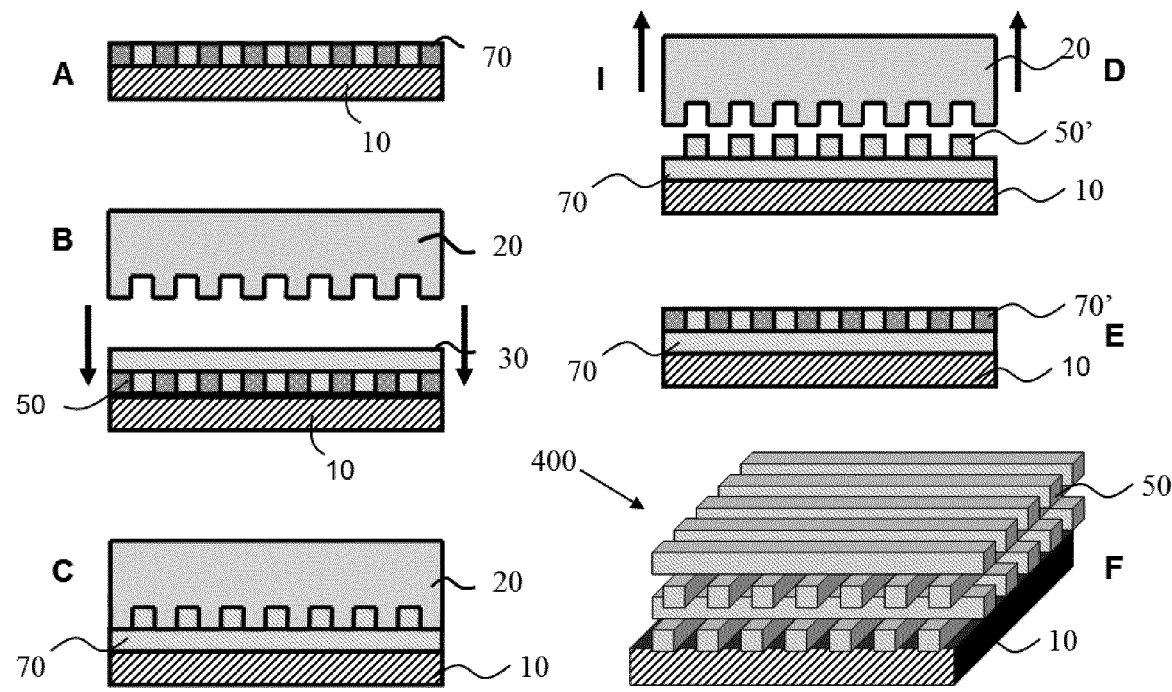
FIG. 6 schematically depicts a method of forming an imprinted layer according to a further embodiment.

A non-limiting example of a method of manufacturing such a three-dimensional structure is shown in FIG. 6. In step A, a planarized layer 70 is formed on a substrate or carrier 10, as previously explained. The patterned layer portion 50 of the planarized layer 30 may be produced by imprint lithography (Substrate Conformal Imprint Lithography, SCIL) using the curable imprinting ink composition 30 in accordance with the method shown in FIG. 4. The patterned layer 50 is filled, i.e. planarized with a sacrificial filling material 60 as previously explained with the aid of FIG. 5. In step B, a next layer of the curable imprinting ink composition 30 according to an embodiment is applied over the planarized layer 70 of step A in any suitable manner, e.g. by spincoating, dispensing or doctor blading.

The curable imprinting ink composition 30 deposited in step B is subsequently embossed by a suitably patterned elastomeric stamp 20 after alignment of the stamp with respect to the substrate 10, as shown in step C. In step C, the imprint orientation of the stamp 20 with the substrate 10 has been rotated 90° with respect to the imprint orientation used to form the first patterned layer 50. It will be appreciated that other orientation rotation angles are equally feasible.

The curable imprinting ink composition 30 is subsequently solidified (densified), e.g. as shown in FIG. 4 to form a further patterned layer 50' as shown in step D. Obviously, the formation of the further patterned layer 50' may be completed after removal of the patterned elastomeric stamp 20, i.e. by completing the polymerization reaction(s) as previously discussed. Removing the patterned elastomeric stamp 20 leaves the further patterned layer 50' on the planarized layer 70 of step A. The newly formed patterned layer 50' may again be planarized as shown in step E to form a further planarized layer 70', after which additional layers may be formed by repeating the steps B-E. The height of the patterned portions of the patterned layers 50, 50' may be reduced using an additional processing step, e.g. by means of reactive ion etching.

The sacrificial planarizing material 60 may be removed afterwards by e.g. dissolving the sacrificial planarizing material 60 in a suitable solvent or by thermal decomposition, thus yielding an optical device 400 in the form of a stacked structure as shown in step F. The imprinting ink composition 30 is particularly suitable for application in this method because it can withstand most solvents required to dissolve the sacrificial planarizing material 60, as well as withstand high temperatures up to 600° C. or even 1000° C., thereby making it particularly suitable for use with sacrificial planarizing materials 60 in the form of thermally degradable compounds such as a TDP.

In any of the aforementioned embodiments may it be necessary to remove residual imprint structures from e.g. the substrate 10, for instance when a layer on the substrate 10 has been patterned using the imprint structures as a mask. The imprint structures may be removed by any suitable etching technique, e.g. reactive ion etching.

The present invention will now be explained in more detail by way of the following non-limiting examples.

Example 1: Preparation of an Acidified Sol

A solution of TMOS (7.941 g) and MTMS (7.107 g) in water (6.57 g) and acetic acid (0.06 g) was prepared, keeping the temperature of the mixture under 20° C. Hydrolysis was subsequently effected at 20° C. for 30 to 120 minutes. Following hydrolysis, water (10.33 g) and 1-propanol (100.56 g) were added, thereby to form the acidified sol.

Example 2: Preparation of an Acidified Sol-Gel Imprinting Ink

An acidified sol-gel imprinting ink was prepared by adding 1-propanol (84 g) and 1-butanol (16 g) to the acidified sol (100 g) prepared in Example 1. The imprinting ink was allowed to equilibrate by storing it between −30° C. and −20° C. for at least 20 hours. The pH for this imprinting ink was 4.5-5.5, as measured by mixing a sample of the composition with an equal volume of deionized water, and measuring the pH of the resulting mixture at normal temperature and pressure (NTP), i.e. at 20° C. and 1 atm. The solid content was 2.5 wt. %.

Examples 3-9: Preparation of Acidified Sol-Gel Imprinting Ink Compositions Comprising Base APTES or TEA were added to the acidified sol-gel imprinting ink prepared in Example 1 to prepare seven acidified sol-gel imprinting ink compositions comprising base (Table II). The base was added in an amount which is 0.1 to 1 wt. % of the imprinting ink composition. In order to compensate for the increase in pH by addition of the base, additional formic acid was used to adjust the pH to 4-6, as measured by mixing a sample of the composition with an equal volume of deionized water, and measuring the pH of the resulting mixture at normal temperature and pressure (NTP), i.e. at 20° C. and 1 atm.

The molar ratio of TEA to formic acid was 1:4. This ratio was found to be optimal in that it permitted adjustment of the pH to 4-6. The molar ratio of APTES to formic acid was 1:1 to 2:1, which permitted adjustment of the pH to 4.5-5.5.

The imprinting ink of Example 2 and the imprinting ink compositions of Example 3-9 were each spincoated onto a silicon substrate for 15 seconds at 1000 rpm. The spincoated layers were then imprinted using a SCIL stamp within 10 to 40 seconds. This was found to lead to a stamp-resist contact line with good capillary wetting, i.e. the stamp was pulled into the resist by capillary forces.

The compositions are shown in Table II, together with their minimum imprint times, i.e. the time required for the crosslinking to occur to the extent that the stamp may be removed without causing damage to the patterned layer. The shelf-life at room temperature (RT; ca. 20° C.) was also qualitatively evaluated. A shelf-life of 7-10 days, for instance, means that after this time the capillary wetting is still satisfactory, meaning that the capillary forces are strong enough such that the stamp is pulled into the resist, displacing the air in front of the contact line.

TABLE II

| Example | Added base | Molar ratio of base to formic acid | Weight % base with respect to silica solids | Minimal imprint time at RT | Minimal imprint time at 50° C. | Shelf-life at RT |
|---|---|---|---|---|---|---|
| 2 | — | — | — | 15-30 min. | 10-30 minutes | 7-10 days |
| 3 | TEA | 4 | 0.5 | | 10 seconds | |
| 4 | TEA | 4 | 0.25 | | 15 seconds | |
| 5 | APTES | 1 | 0.375 | | 20-30 seconds | ~1 day |
| 6 | APTES | 1 | 0.25 | | 2-3 minutes | ~1.5 days |
| 7 | APTES | 1* | 0.15 | | 60-70 seconds | 2 days |
| 8 | APTES | 2* | 0.2 | | 60 sec | >1 day |
| 9 | APTES | 1.5* | 0.2 | | 60 sec | >1 day |

*The sol-gel composition was prepared according to Example 3, except that the acidified sol was prepared using half the quantity of acetic acid as that used in Example 1.

At RT, the imprint time for the base-free imprinting ink of Example 2 was 15-30 minutes. At 50° C., the imprint time was 10-15 minutes. The variation is mainly due to variations in ambient relative humidity levels.

It can be seen from Table II that the imprinting ink compositions of Examples 3-9 were successfully imprinted using much shorter imprinting times. This is due to the evaporation of formic acid (and the solvents) during coating and imprinting resulting in basification of the layer by the TEA or APTES, as previously described. The gelation in the basified layer occurs more rapidly than in the case of the imprinting ink of Example 2.

It was found that adjustment of the pH to 4-7, as measured using the abovementioned method, controls crosslinking in the imprinting ink composition. When 1 wt. % TEA with respect to silica solids was added to the imprinting ink of Example 2, the pH of the resist was measured to be greater than 7, up to 7.5. No additional acid was used in this case to adjust the measured pH to 4-7. When used immediately, this imprinting ink composition exhibited a minimum imprinting time of 5-15 seconds. However, the shelf-life of the composition was poor; imprinting could no longer be performed using the composition 2-4 hours following addition of the base. This was due to the fact that the composition was already too far crosslinked after spincoating. This also demonstrates the effect of basification on the rate of crosslinking.

Figure 7:
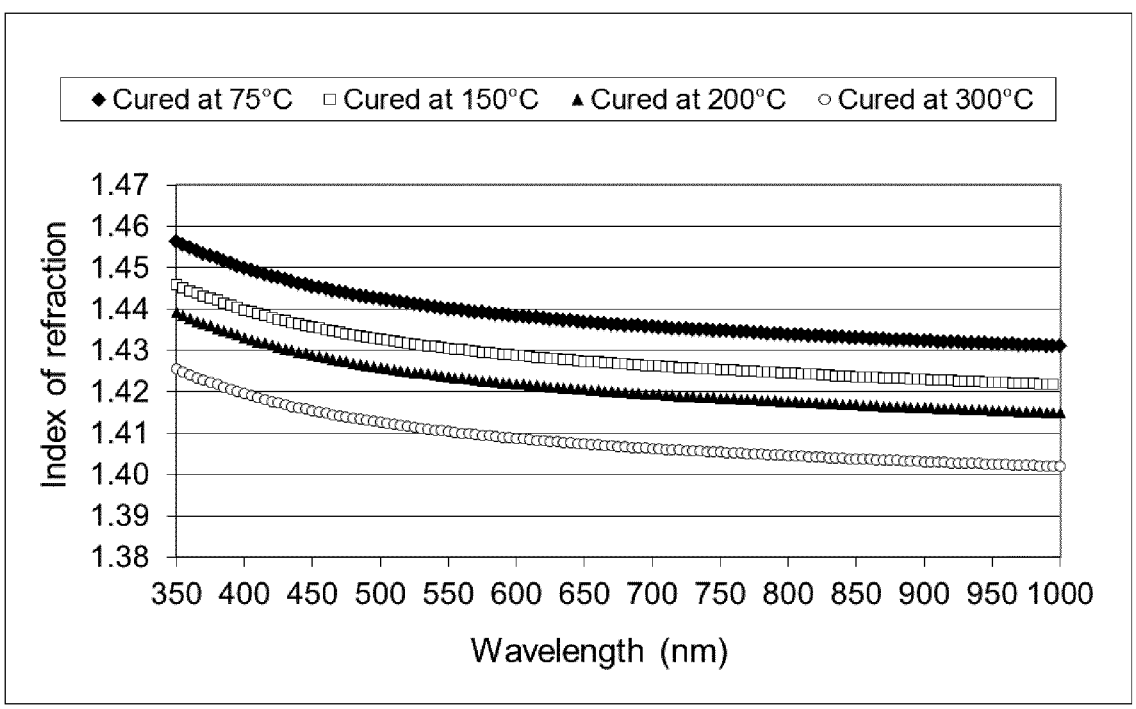
FIG. 7 shows a graph of wavelength vs. refractive index for hardened imprinted layers according to an embodiment.
Figure 8:
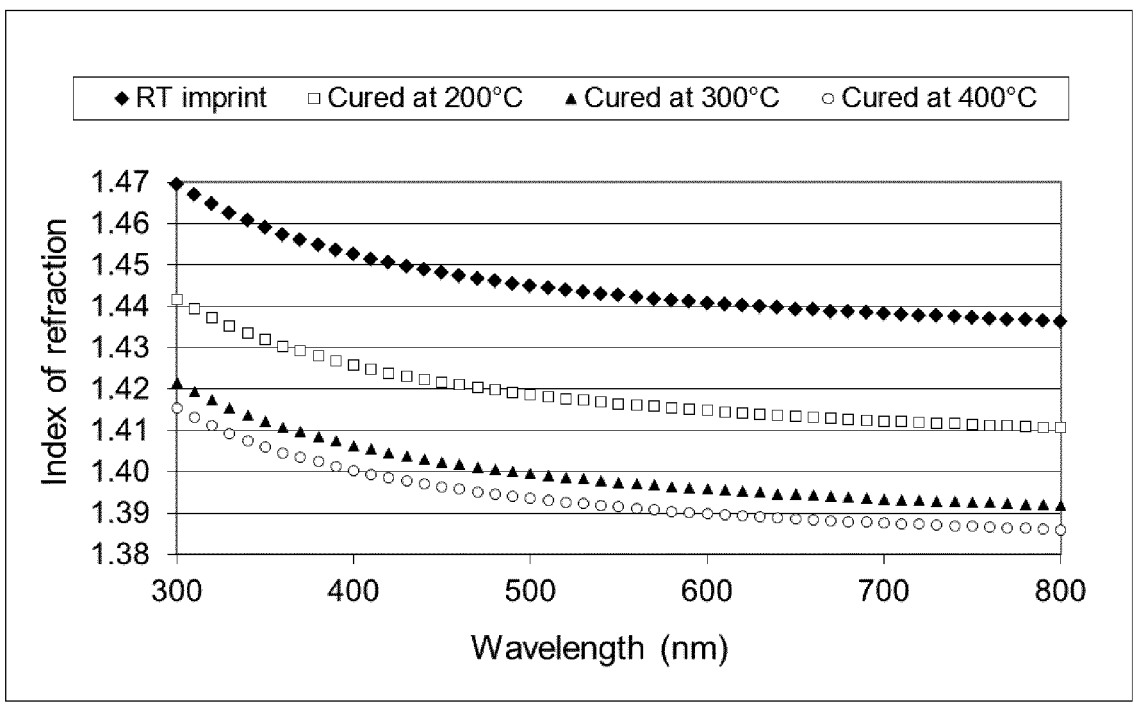
FIG. 8 shows a graph of wavelength vs. refractive index for hardened imprinted layers for a comparative example in which no base is used in the imprinting composition.

Wavelength variable angle spectrometry ellipsometry measurements were carried out with a VASE® Ellipsometer (J.A. Woollam Ellipsometry Solutions) using the imprinted layers of Examples 2 and 6 which were subjected to hardening (post-annealing) at RT, 75° C., 150° C., 200° C. and 300° C. FIG. 7 shows the refractive index vs. wavelength for the hardened layers made from the imprinted layer of Example 6. FIG. 8 shows the refractive index vs. wavelength for the hardened layers made from the imprinted layer of Example 2, as well as the plot for the layer after imprinting only (denoted "RT imprint" in FIG. 8).

Comparing the hardened layers after post-curing at 200° C. and 300° C., it is evident that the refractive indices are higher for the layers formed using the inventive ink composition of Example 6 (FIG. 7) compared to the layers made from the ink of Example 2 (FIG. 8) which does not include the relatively low vapour pressure base. The higher the refractive index, the denser the patterned layer, thus the less porous the patterned layer. These Examples thus demonstrate that the inventive imprinting ink compositions lead to less porous patterned layers, which is due to the control over the gelation provided by the volatile base, as previously described.

Stamp longevity tests were also carried out using the AutoSCIL™ 200 mm tooling from Philips SCIL Nanoimprint Solutions. For mass production the stamp lifetime is very important as changing the stamp introduces downtime and additional stamps increase cost. Using the imprinting ink composition in Table II with 0.375 wt. % APTES with respect to silica solids, and an APTES:formic acid ratio of 1:1 several stamps were run in the abovementioned tooling. Three stamps reached 700+ imprints without noticeable degradation in performance. One stamp reached 1200 imprints without noticeable degradation in performance. The stamps replicated <50 nm features on a pitch of ~150 nm and SEM and optical measurements verified that the features were identical to the first 10 prints (via optical methods) to within 0.5 nm.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:
1. An imprinting composition comprising:
a sol; and
an additive,
wherein the additive is arranged to promote gelation of the composition during imprinting at an imprinting temperature between 15° C. and 120° C.,
wherein the additive is the reversible reaction product of a protic acid and a proton-accepting base, wherein the composition has a pH of 4-7 when mixed with an equal volume of deionized water and measured at 20° C. and 1 atmosphere, wherein the vapor pressure of the acid is higher than that of the base at the imprinting temperature thereby enabling basifying of the composition during the imprinting.

2. The composition according to claim 1, wherein the sol comprises the hydrolysis product of at least one of a trialkoxysilane and a tetraalkoxysilane.

3. The composition according to claim 2,
wherein the sol comprises the hydrolysis product of the trialkoxysilane and the tetraalkoxysilane,
wherein the molar ratio of the tetraalkoxysilane to the trialkoxysilane is from 1:1 to 0.45:0.55.

4. The composition according to claim 3,
wherein the tetraalkoxysilane is selected from tetramethoxyorthosilicate and tetraethoxyorthosilicate,
wherein the trialkoxysilane is selected from methyltrimethoxysilane and methyltriethoxysilane.

5. The composition according to claim 3,
wherein the base includes an alkoxysilyl-functionalised amine,
wherein the composition comprises the condensation product of the hydrolysis product and the alkoxysilyl-functionalised amine,
wherein the alkoxysilyl-functionalised amine is aminopropyltriethoxysilane.

6. The composition according to claim 2,
wherein the tetraalkoxysilane is selected from tetramethoxyorthosilicate and tetraethoxyorthosilicate,
wherein the trialkoxysilane is selected from methyltrimethoxysilane and methyltriethoxysilane.

7. The composition according to claim 6,
wherein the base includes an alkoxysilyl-functionalised amine,
wherein the composition comprises the condensation product of the hydrolysis product and the alkoxysilyl-functionalised amine,
wherein the alkoxysilyl-functionalised amine is aminopropyltriethoxysilane.

8. The composition according to claim 2,
wherein the base includes an alkoxysilyl-functionalised amine,
wherein the composition comprises the condensation product of the hydrolysis product and the alkoxysilyl-functionalised amine.

9. The composition according to claim 2,
wherein the base includes an alkoxysilyl-functionalised amine,
wherein the composition comprises the condensation product of the hydrolysis product and the alkoxysilyl-functionalised amine,
wherein the alkoxysilyl-functionalised amine is aminopropyltriethoxysilane.

10. The composition according to claim 1, wherein the sol comprises the hydrolysis product of at least one of a titanium alkoxide, a zirconium alkoxide and a hafnium alkoxide.

11. The composition according to claim 1, wherein the base includes triethanolamine.

12. The composition according to claim 1, wherein the acid includes at least one of a first compound and a second compound,
wherein the first compound is

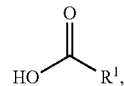

wherein $R^2$ is selected from the group consisting of hydrogen, methyl or propyl,
wherein the first compound is

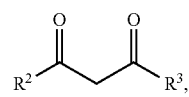

wherein $R^2$ and $R^3$ are individually selected from hydrogen and $C_1$-$C_3$ alkyl.

13. The composition according to claim 1, wherein the sol comprises an alcohol.

14. The composition according claim 1, wherein the sol comprises water.

15. The composition according to claim 1,
wherein the sol comprises an alcohol,
wherein the alcohol is at least one of 1-propanol, 2-propanol, 1-butanol, 2-butanol, t-butanol and 1-methoxy-2-propanol.

16. A kit for forming the composition as claimed in claim 1,
wherein the kit comprises a first component and a second component,
wherein the first component comprises the acid and the sol,
wherein the second component comprises the base.

17. A method of providing a patterned layer, the method comprising:
providing a composition, the composition comprising:
a sol; and
an additive,
wherein the additive is arranged to promote gelation of the composition during imprinting at an imprinting temperature between 15° C. and 120° C.,
wherein the additive is the reversible reaction product of a protic acid and a proton-accepting base,
wherein the composition has a pH of 4-7 when mixed with an equal volume of deionized water and measured at 20° C. and 1 atmosphere,
wherein the vapor pressure of the acid is higher than that of the base at the imprinting temperature thereby enabling basifying of the composition during the imprinting;
forming a layer, wherein the layer comprises the composition; and
imprinting the layer with a patterned stamp at an imprinting temperature between 15° C. and 120° C., such that the layer is basified during the imprinting.

18. The method according to claim 17, further comprising removing the patterned stamp after the imprinting.

19. The method according to claim 17, further comprising:
- removing the patterned stamp after the imprinting; and
- heating the patterned layer after removing the patterned stamp at a temperature between 70° C. and 400° C.

20. An etch mask comprising a patterned layer, the layer comprising:
- a sol; and
- an additive,
- wherein the additive is arranged to promote gelation of the composition during imprinting at an imprinting temperature between 15° C. and 120° C.,
- wherein the additive is the reversible reaction product of a protic acid and a proton-accepting base,
- wherein the composition has a pH of 4-7 when mixed with an equal volume of deionized water and measured at 20° C. and 1 atmosphere,
- wherein the vapor pressure of the acid is higher than that of the base at the imprinting temperature thereby enabling basifying of the composition during the imprinting;
- wherein the layer is imprinted with a patterned stamp at an imprinting temperature between 15° C. and 120° C., such that the layer is basified during the imprinting.

* * * * *